(12) United States Patent
Tsai et al.

(10) Patent No.: US 8,405,211 B2
(45) Date of Patent: Mar. 26, 2013

(54) BUMP PAD STRUCTURE

(75) Inventors: Hao-Yi Tsai, Hsin-Chu (TW);
Hsien-Wei Chen, Sinying (TW);
Yu-Wen Liu, Taipei (TW); Ying-Ju Chen, Tuku Township (TW); Hsiu-Ping Wei, Dajia Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 419 days.

(21) Appl. No.: 12/726,449

(22) Filed: Mar. 18, 2010

(65) Prior Publication Data

US 2010/0283148 A1    Nov. 11, 2010

Related U.S. Application Data

(60) Provisional application No. 61/176,522, filed on May 8, 2009.

(51) Int. Cl.
*H01L 23/485* (2006.01)

(52) U.S. Cl. ............... 257/737; 257/738; 257/E23.02; 257/E21.508; 438/614

(58) Field of Classification Search .............. 257/737, 257/738, E23.02, E23.021, E21.508, 778; 438/714, 613, 614, 108
See application file for complete search history.

(56) References Cited

U.S. PATENT DOCUMENTS

| 7,196,428 | B2 | 3/2007 | Chen |
| 7,622,309 | B2 * | 11/2009 | Su et al. ..................... 438/14 |
| 7,777,333 | B2 * | 8/2010 | Bachman et al. .......... 257/737 |

* cited by examiner

*Primary Examiner* — Roy Potter
(74) *Attorney, Agent, or Firm* — Slater & Matsil, L.L.P.

(57) ABSTRACT

An embodiment is a bump bond pad structure that comprises a substrate comprising a top layer, a reinforcement pad disposed on the top layer, an intermediate layer above the top layer, an intermediate connection pad disposed on the intermediate layer, an outer layer above the intermediate layer, and an under bump metal (UBM) connected to the intermediate connection pad through an opening in the outer layer. Further embodiments may comprise a via mechanically coupling the intermediate connection pad to the reinforcement pad. The via may comprise a feature selected from the group consisting of a solid via, a substantially ring-shaped via, or a five by five array of vias. Yet, a further embodiment may comprise a secondary reinforcement pad, and a second via mechanically coupling the reinforcement pad to the secondary reinforcement pad.

20 Claims, 16 Drawing Sheets

BUMP PAD STRUCTURE

This application claims the benefit of U.S. Provisional Patent Application Ser. No. 61/176,522, filed on May 8, 2009, and entitled "Bump Pad Structure," which application is incorporated herein by reference.

TECHNICAL FIELD

The present invention relates generally to a bump pad structure for a semiconductor device, and more particularly to a bump pad structure for a flip chip assembly.

BACKGROUND

A flip chip package includes a downward facing semiconductor chip electrically and mechanically attached to a substrate by solder bumps. Flip chip packages are usually preferred over other conventional packages because of the scalability of flip chip packages that allows their use in smaller applications. But as the sizes of flip chip packages decrease and as the uses of low-k dielectrics increase, problems with the bump pad metal and low-k dielectric may occur from mechanical stresses on the flip chip package.

FIG. 1A is a cross-sectional view of a solder bump pad and a portion of its underlying interconnect structure. A solder bump 2 is physically connected to an under bump metal (UBM) pad 4 that is connected to an aluminum pad 8 through an opening in an outer passivation layer 6 on a semiconductor chip. The aluminum pad 8 rests on an inner passivation layer 10. The inner passivation layer 10 is above an undoped silicon glass (USG) layer 12 that is on a low-k dielectric layer 14. The USG layer 12 may comprise multiple individual metal layers that comprise circuitry. An aluminum trace 16 electrically couples the aluminum pad 8 to an aluminum contact 18 in the interconnect structure. Vias 20a, 20b, and 20c through the inner passivation layer 10 connect the aluminum contact 18 to a contact 22. The contact 22 is coupled to another contact 26 through vias 24. Additional contacts and vias may comprise the interconnect structure as required by the semiconductor device.

FIG. 1B is a layout of the UBM pad 4, the aluminum pad 8, the aluminum trace 16, the aluminum contact 18, and vias 20a, 20b, and 20c. The outer octagonal area represents the aluminum pad 8. The middle octagonal area represents the UBM pad 4. The inner octagonal area represents the depressed portion of the UBM pad 4.

The bump pad illustrated in FIGS. 1A and 1B are generally used on flip chip assemblies. Flip chip assemblies are preferred in modern technologies because of their scalability for use in smaller technologies. Yet, as the assembly size decreases, particularly to 22 nm technology, and as low-k dielectric usage becomes more prevalent, particularly when the k value is less than 2.5, the impact of the mechanical stresses arising from the bump pad increases. Stresses on the bump pad, such as peeling or shear forces caused by coefficient of thermal expansion (CTE) mismatch between the semiconductor device and the attached package substrate, can cause mechanical failures of the semiconductor device, such as cracking of the USG, low-k dielectric, or solder bump, due to the weakened bump pad.

Another structure commonly used in flip chip technology is the direct bump on copper (DBOC) structure. In the DBOC structure, the UBM is in direct contact with the copper metal of the top metallization layer. No aluminum pad or inner passivation layer is used in the DBOC structure. Without an aluminum pad or an inner passivation layer to act as a buffer, a DBOC structure generally has less mechanical strength and suffers from the same problems as discussed above. Accordingly, there is a need in the prior art for a bump pad with increased mechanical strength to overcome the deficiencies of the prior art.

SUMMARY OF THE INVENTION

These and other problems are generally solved or circumvented, and technical advantages are generally achieved, by embodiments of the present invention that increase the mechanical strength of the bump bond pad structure and thus protect the interface between an undoped silicon glass (USG) layer and a low-k dielectric layer.

In accordance with an embodiment of the present invention, a bump bond pad structure comprises a substrate comprising a top layer, a reinforcement pad disposed on the top layer, an intermediate layer above the top layer, an intermediate connection pad disposed on the intermediate layer, an outer layer above the intermediate layer, and an under bump metal (UBM) connected to the intermediate connection pad through an opening in the outer layer.

In accordance with another embodiment of the present invention, a bump bond pad structure comprises a copper pad on a top layer of a substrate, an aluminum pad on an inner passivation layer, a via mechanically coupling the copper pad to the aluminum pad, and an UBM mechanically and electrically coupled to the aluminum pad through an opening in an outer passivation layer. The inner passivation layer is on the top layer of the substrate.

In accordance with another embodiment of the present invention, a method for creating a bump bond pad structure, the method comprises forming a reinforcement pad on a top layer of a substrate, forming an intermediate layer on the top layer of the substrate, forming an intermediate connection pad on the intermediate layer and a via through the intermediate layer to couple the intermediate connection pad to the reinforcement pad, forming an outer layer over the substrate, and forming an UBM in an opening of the outer layer to couple the UBM to the intermediate connection pad.

An advantage of an embodiment of the present invention is generally a reduction in stresses on an interface between an USG layer and a low-k dielectric layer caused by an increase in the Young's modulus of the structure. The increase in the Young's modulus generally causes the entire structure to have more mechanical strength.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a bump pad for a flip chip assembly. The invention may also be applied, however, to any packaging assembly that uses solder bump pads, such as a DBOC structure.

Figure 2:
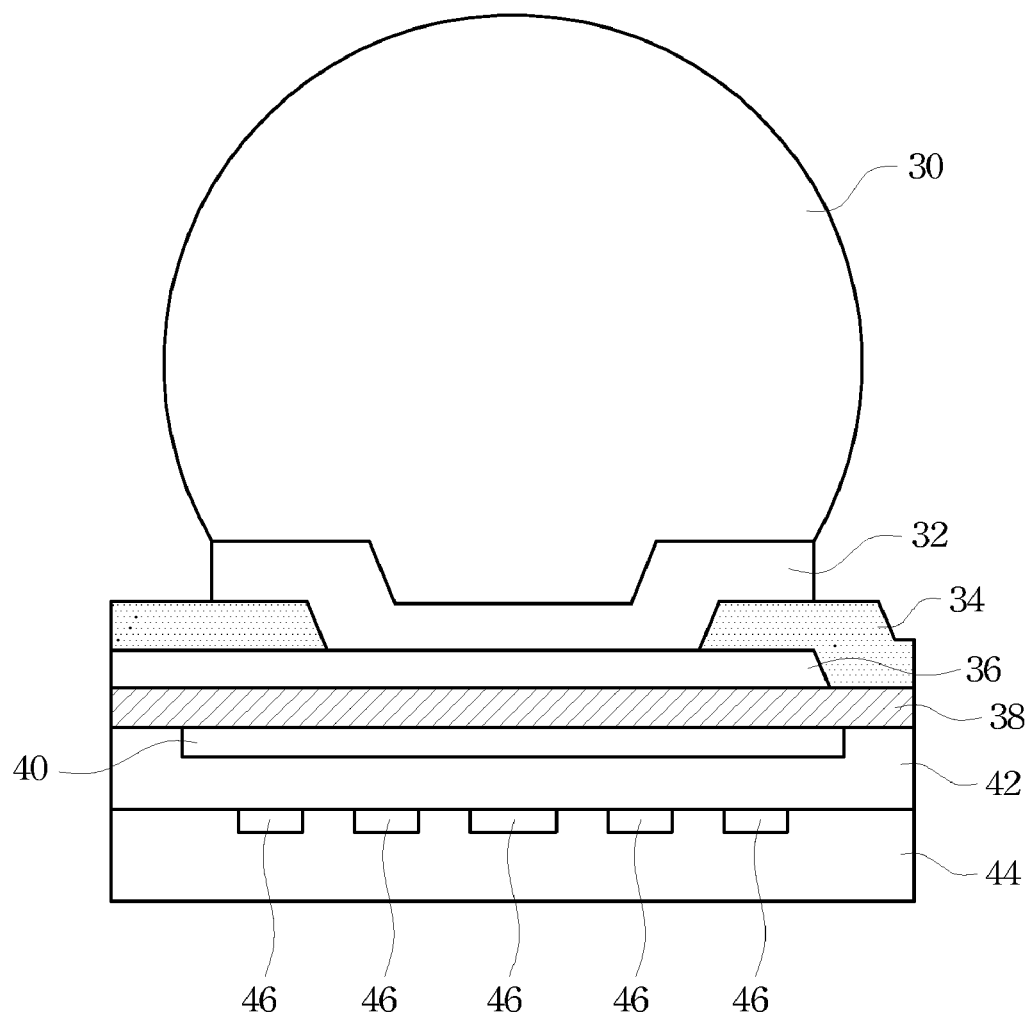
FIG. 2 is a cross-sectional view of a bump pad structure in accordance with an embodiment of the present invention.
Figure 8:
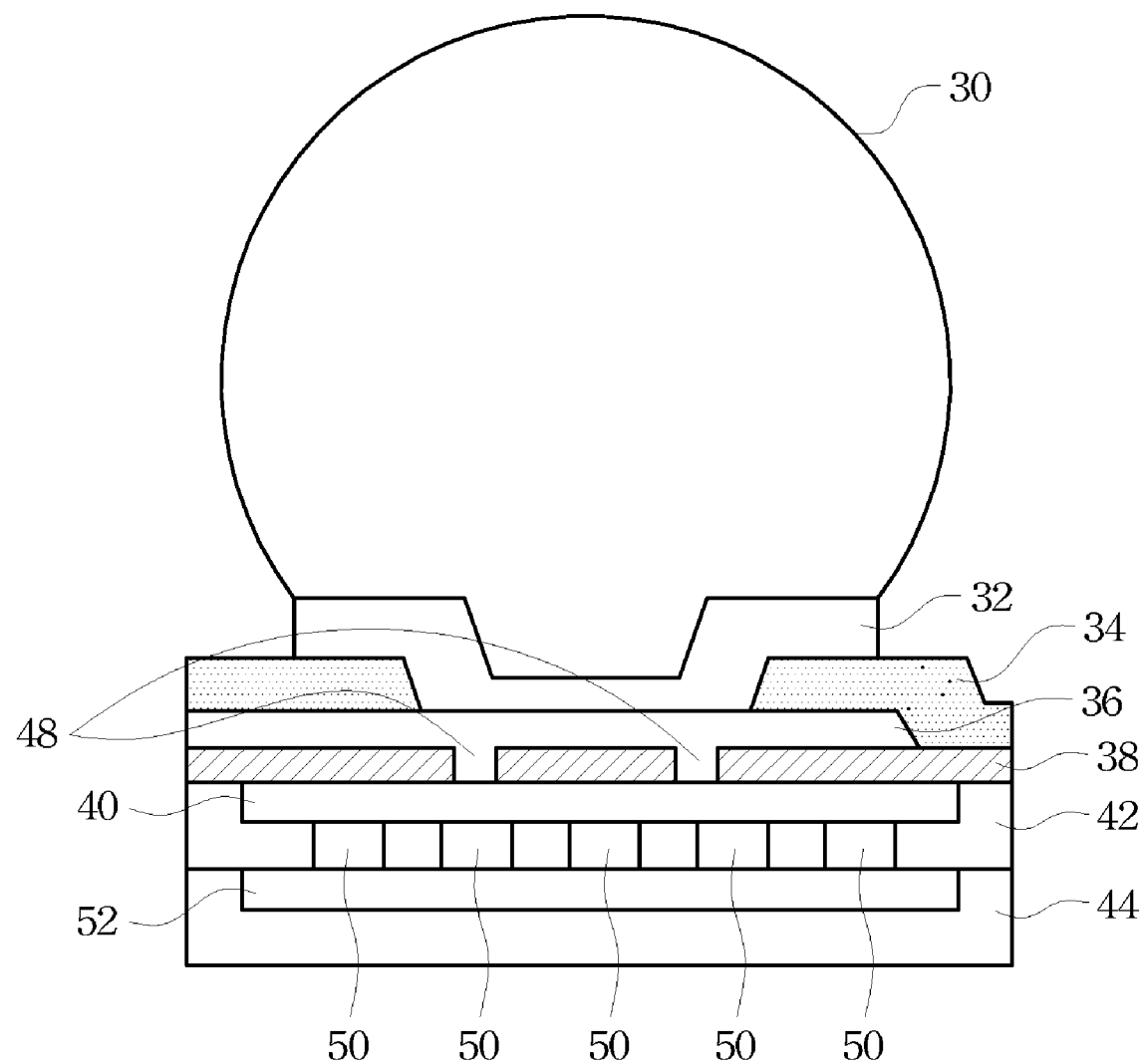
FIG. 8 is a cross-sectional view of a bump pad structure in accordance with a further embodiment of the present invention.

FIG. 2 illustrates a first embodiment of the invention. A solder bump 30 is physically connected to an under bump metal (UBM) pad 32 that is connected to an aluminum pad 36 through an opening in an outer passivation layer 34 on a semiconductor chip. The aluminum pad 36 rests on an inner passivation layer 38. The inner passivation layer 38 is above an undoped silicon glass (USG) layer 42 that is on a low-k dielectric layer 44. A solid copper pad 40 is on the USG layer 42 beneath the aluminum pad 36. The low-k dielectric layer 44 may also comprise circuitry 46. The layers may also comprise any other known configuration or material. For example, the low-k dielectric layer 44 may instead be another USG layer. Further, not shown in FIG. 2, and subsequent FIGS. 3 and 8, is an aluminum trace electrically coupling an interconnect structure to the aluminum pad 36.

Figure 3:
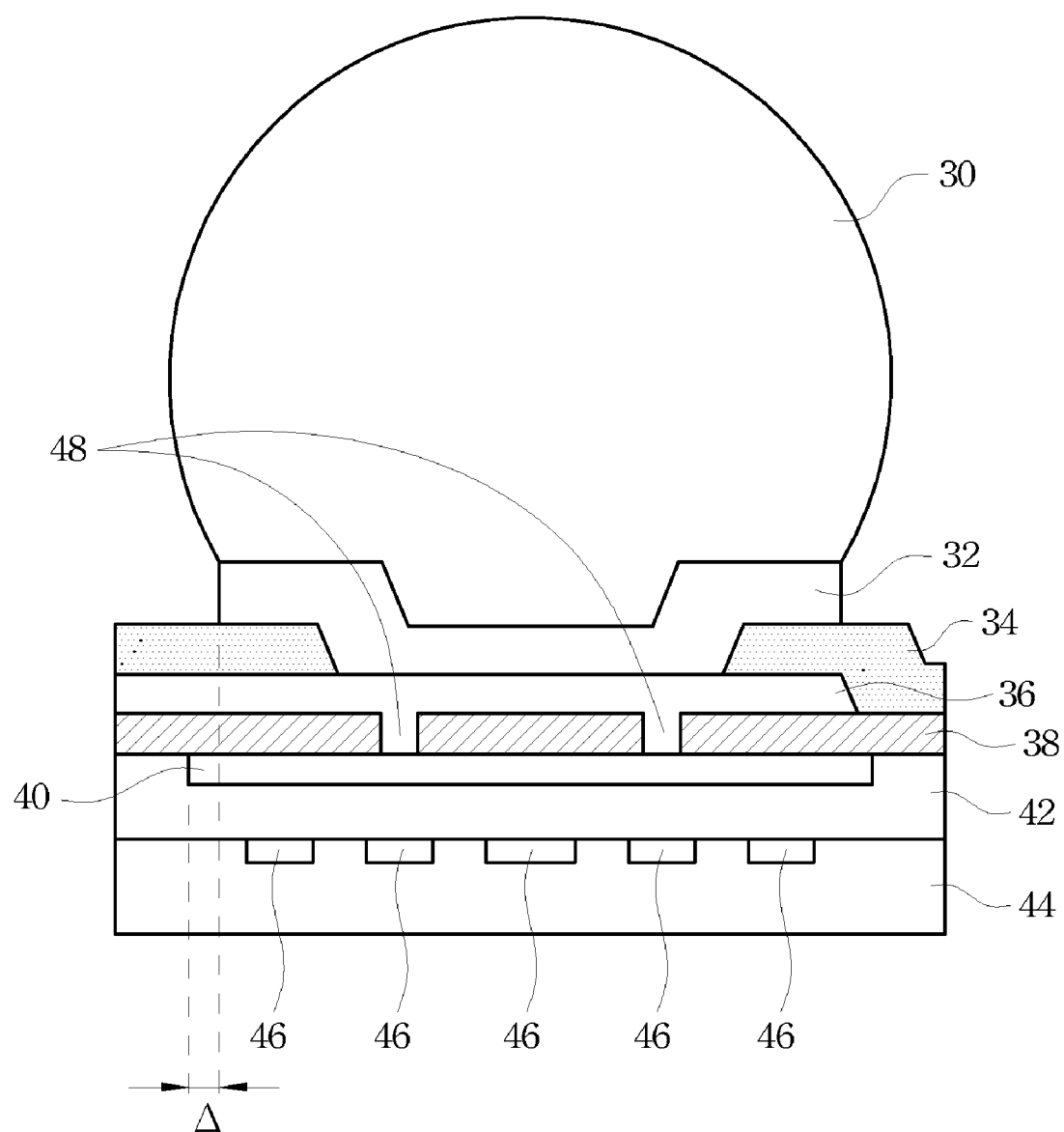
FIG. 3 is a cross-sectional view of a bump pad structure in accordance with a further embodiment of the present invention.

FIG. 3 represents another embodiment. FIG. 3 is the same structure as FIG. 2, except the structure in FIG. 3 has vias 48 connecting the aluminum pad 36 to the copper pad 40.

Figure 1A:
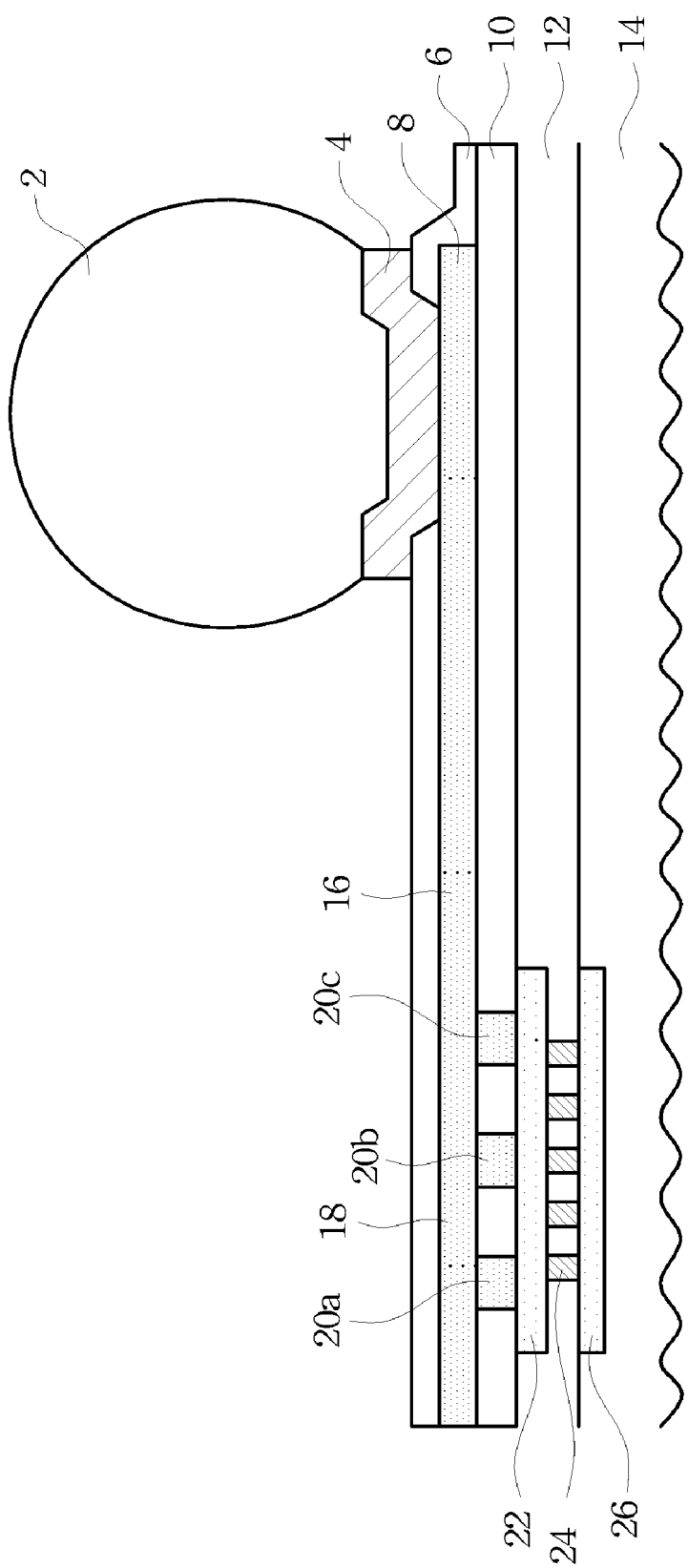
FIG. 1A is a cross-sectional view of a conventional bump pad structure and interconnect.
Figure 1B:
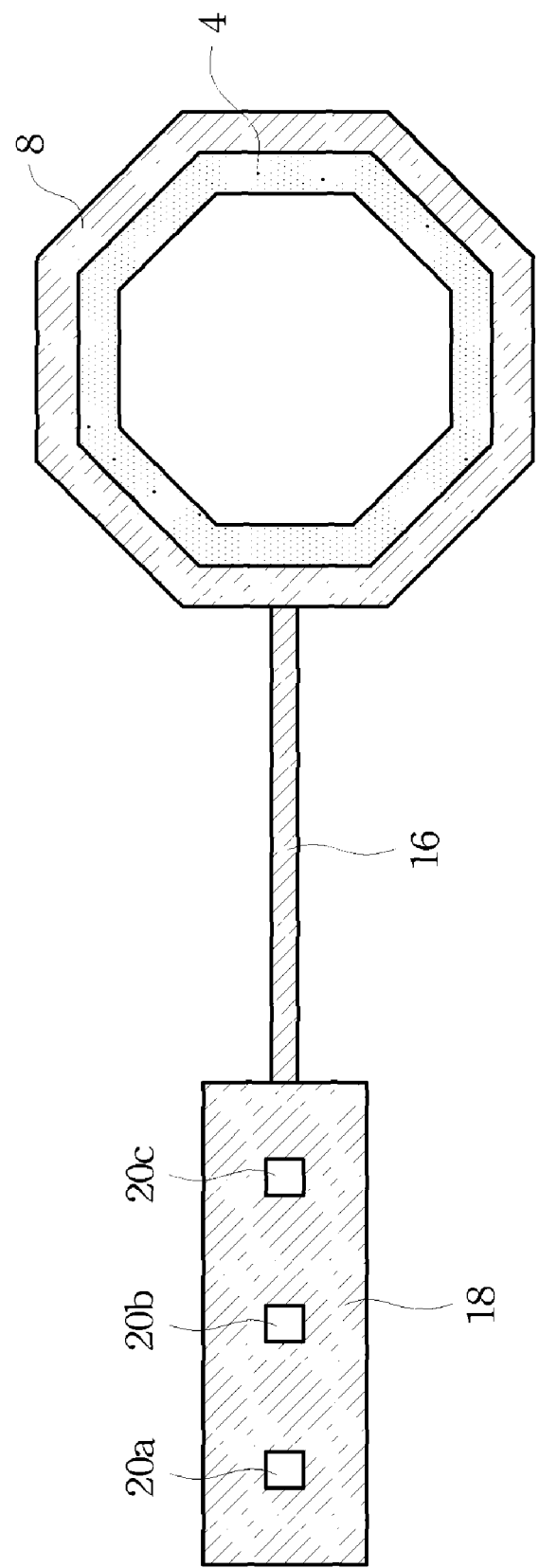
FIG. 1B is a plan view of a conventional bump pad structure and interconnect.
Figure 4:
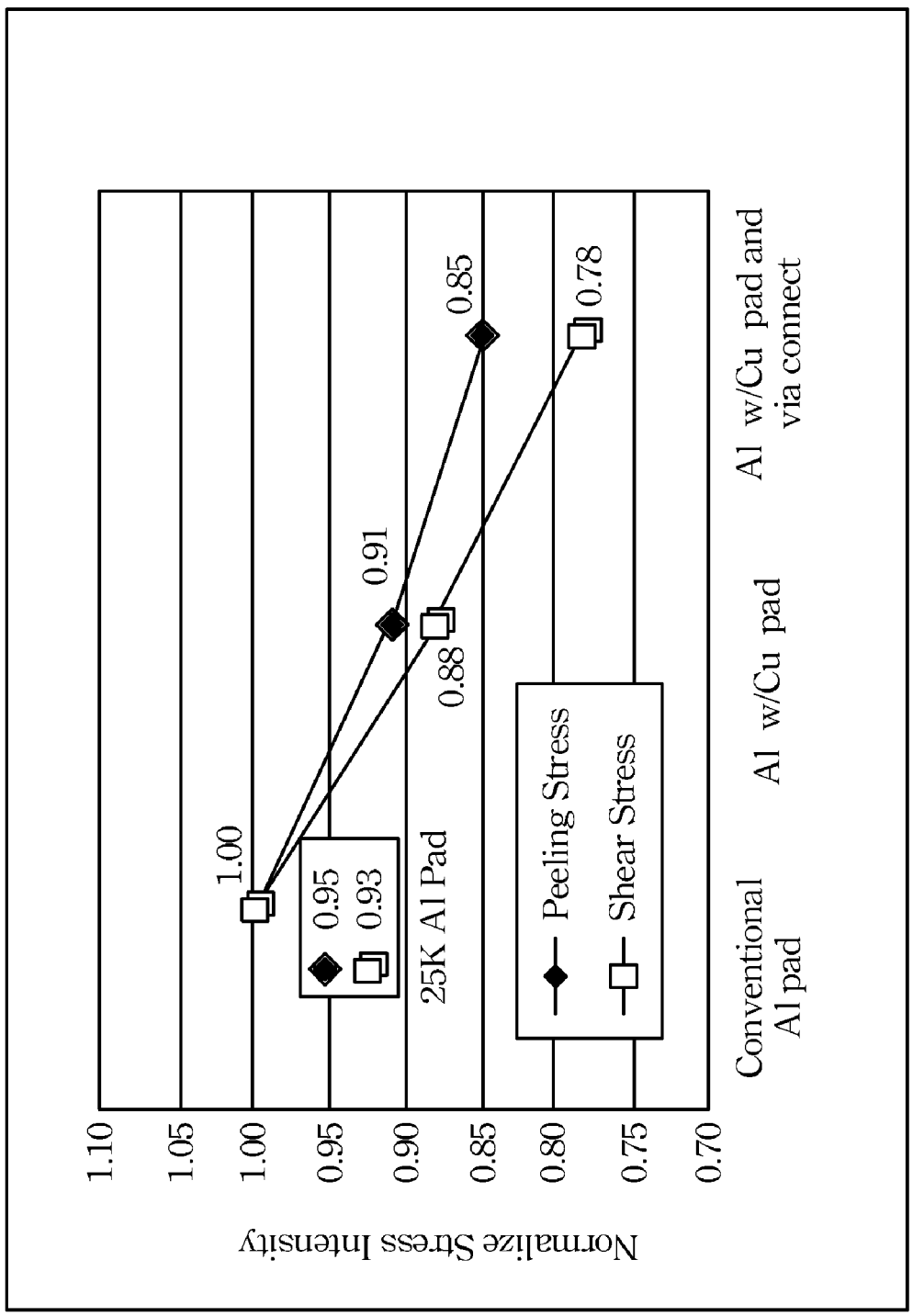
FIG. 4 is a chart comparing the stresses at the interface of the undoped silicon glass (USG) layer and the low-k dielectric layer between the conventional structure and embodiments of the present invention.

These embodiments reduce the stresses on the USG layer 42 and low-k dielectric layer 44. FIG. 4 is a chart illustrating the reduction of stresses at the interface of the USG layer 42 and the low-k dielectric layer 44. The conventional aluminum pad is represented in FIG. 1A. The aluminum pad with a copper pad is illustrated in FIG. 2, and the aluminum pad with the copper pad and via connection is in FIG. 3. The stresses on the interface are normalized using the conventional pad as a baseline. The aluminum pad and copper pad structure (FIG. 2) had a reduction in peeling stress of nine percent and in shear stress of twelve percent from the normalized baseline. The aluminum pad and copper pad with vias structure (FIG. 3) had a reduction in peeling stress of fifteen percent and in shear stress of twenty-two percent from the baseline.

The reduction in stresses on the interface is generally caused by an increase in the Young's modulus caused by adding the copper pad 40. The Young's modulus of the low-k dielectric is approximately 10 GPa, and the Young's modulus of the USG is approximately 70 GPa. However, the Young's modulus of copper is approximately 128 GPa. Accordingly, inserting copper into the structure will generally increase the Young's modulus of the structure to increase the mechanical strength to better protect the interface.

Figure 5:
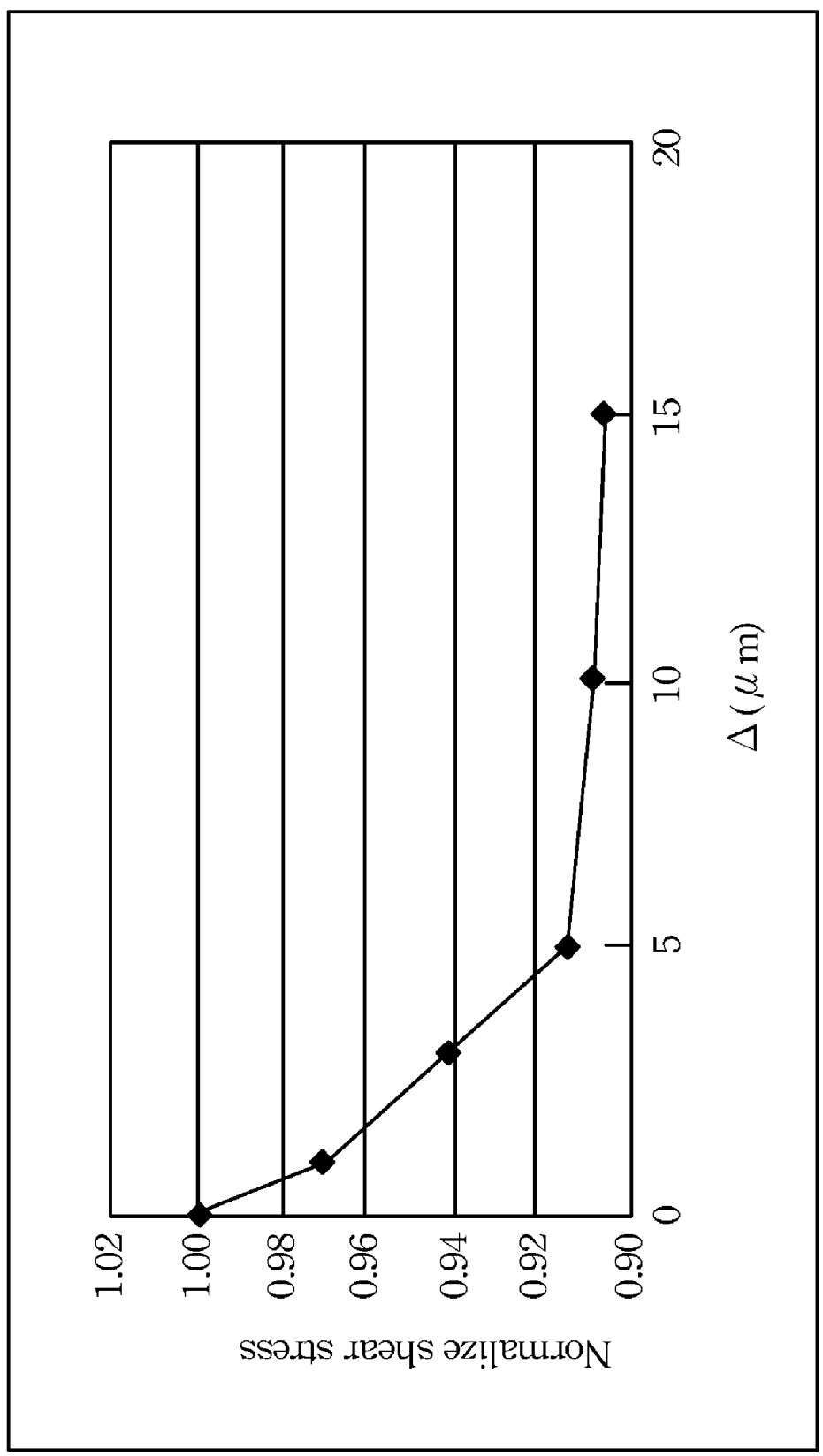
FIG. 5 is a chart illustrating the effects of the dimensions of the copper pad on the stresses at the interface of the USG layer and the low-k dielectric layer.

Not only can the type of structure used affect the stresses on the USG layer 42 and the low-k dielectric layer 44, but also the dimensions of the copper pad 40 can affect the stresses. FIG. 5 is a chart of how the dimensions of the copper pad 40 can affect the stresses. The x-axis of the chart is delta $\Delta$ in micrometers. Delta $\Delta$ represents the difference of the circumradius of the UBM pad 32 from the circumradius of the copper pad 40 as illustrated in FIG. 3. In FIG. 5, the stresses on the interface of the USG layer 42 and the low-k dielectric layer 44 are normalized to a baseline of when the cirumradius of the copper pad 40 equals the circumradius of the UMB pad 32 such that delta $\Delta$ is zero. As the chart shows, the stresses decrease as delta $\Delta$ increases, yet the decrease in normalized stress is relatively small once delta $\Delta$ exceeds five micrometers. Thus, the delta $\Delta$ can be said to become saturated at five micrometers. Accordingly, delta $\Delta$ is preferred to be about five micrometers although delta could be any possible size.

Figure 6A:
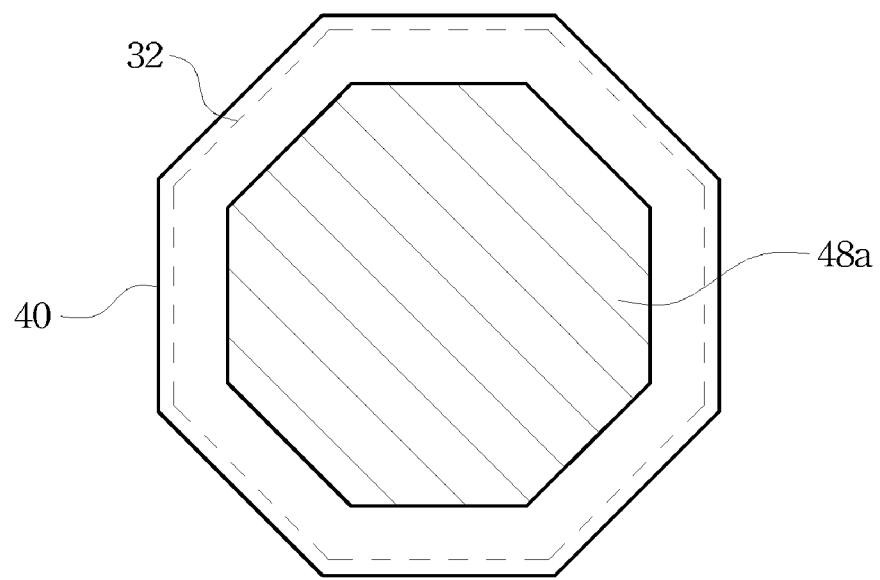
FIGS. 6A through 6D are plan views of vias and a bump pad structure in accordance with embodiments of the present invention.
Figure 6B:
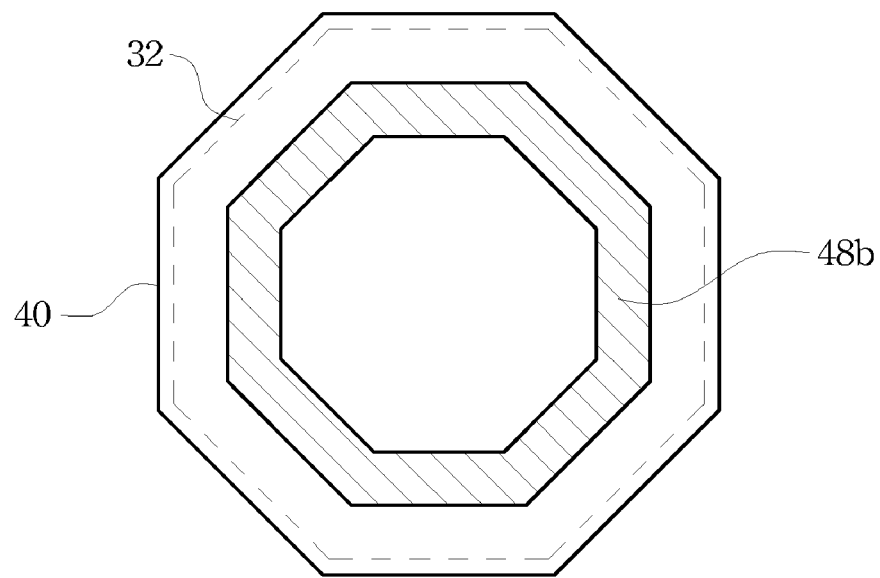
Figure 6C:
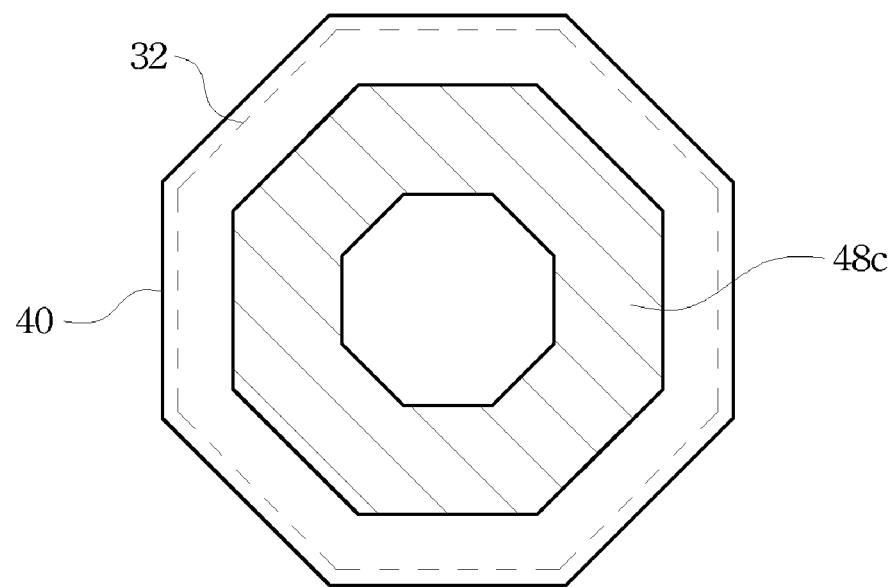
Figure 6D:
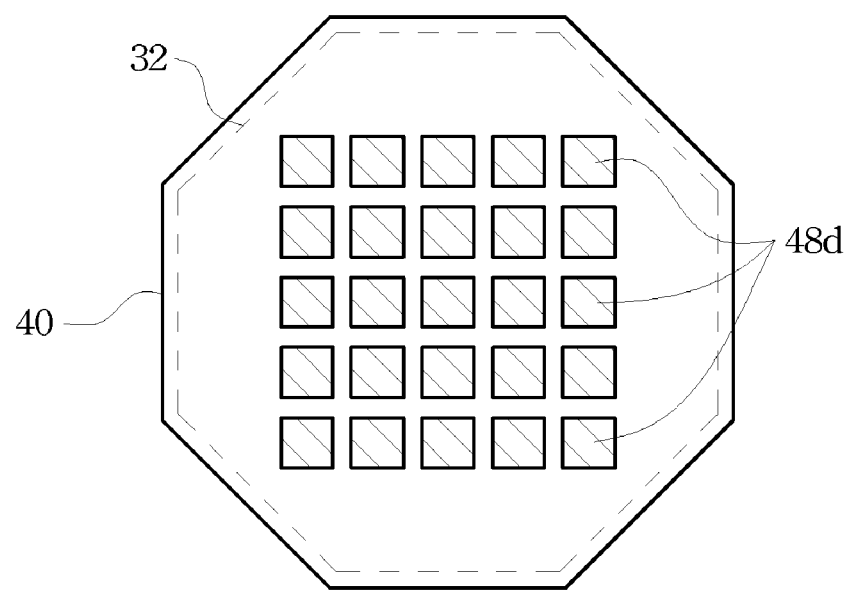

Further, the layout of the vias 48 used to connect the aluminum pad 36 to the copper pad 40 can affect the stresses on the USG layer 42 and the low-k dielectric layer 44. FIGS. 6A through 6D are exemplary layouts of vias 48. FIG. 6A shows a layout with a solid octagonal via 48a. The dashed line represents the layout of the UBM pad 32, and the solid line is the copper pad 40. Generally, the circumradius of the UBM pad 32 is between approximately seventy-five and one hundred twenty micrometers, and the circumradius of the aluminum pad 36 (not shown) is approximately four micrometers larger than the circumradius of the UBM pad 32. FIG. 6B shows an octagonal ring via 48b in which the outer circumradius of the via 48b is ten micrometers larger than the inner circumradius of the via 48b. FIG. 6C shows an octagonal ring via 48c in which the outer circumradius of the via 48c is twenty micrometers larger than the inner circumradius of the via 48c. The vias in FIGS. 6B and 6C have surface areas of 28.4 percent and 52.1 percent, respectively, of the surface area of the aluminum pad 36. Further, the difference of the inner and outer circumradii of the octagonal ring vias 48b and 48c may be increased or decreased, such as to five micrometers or to twenty-five micrometers. With a five micrometer difference, the surface area of the via is 14.8 percent of the aluminum pad 36, and with a twenty-five micrometer difference, the surface area of the via is 62.1 percent of the aluminum pad 36. FIG. 6D shows a five by five array of vias 48b.

Figure 7:
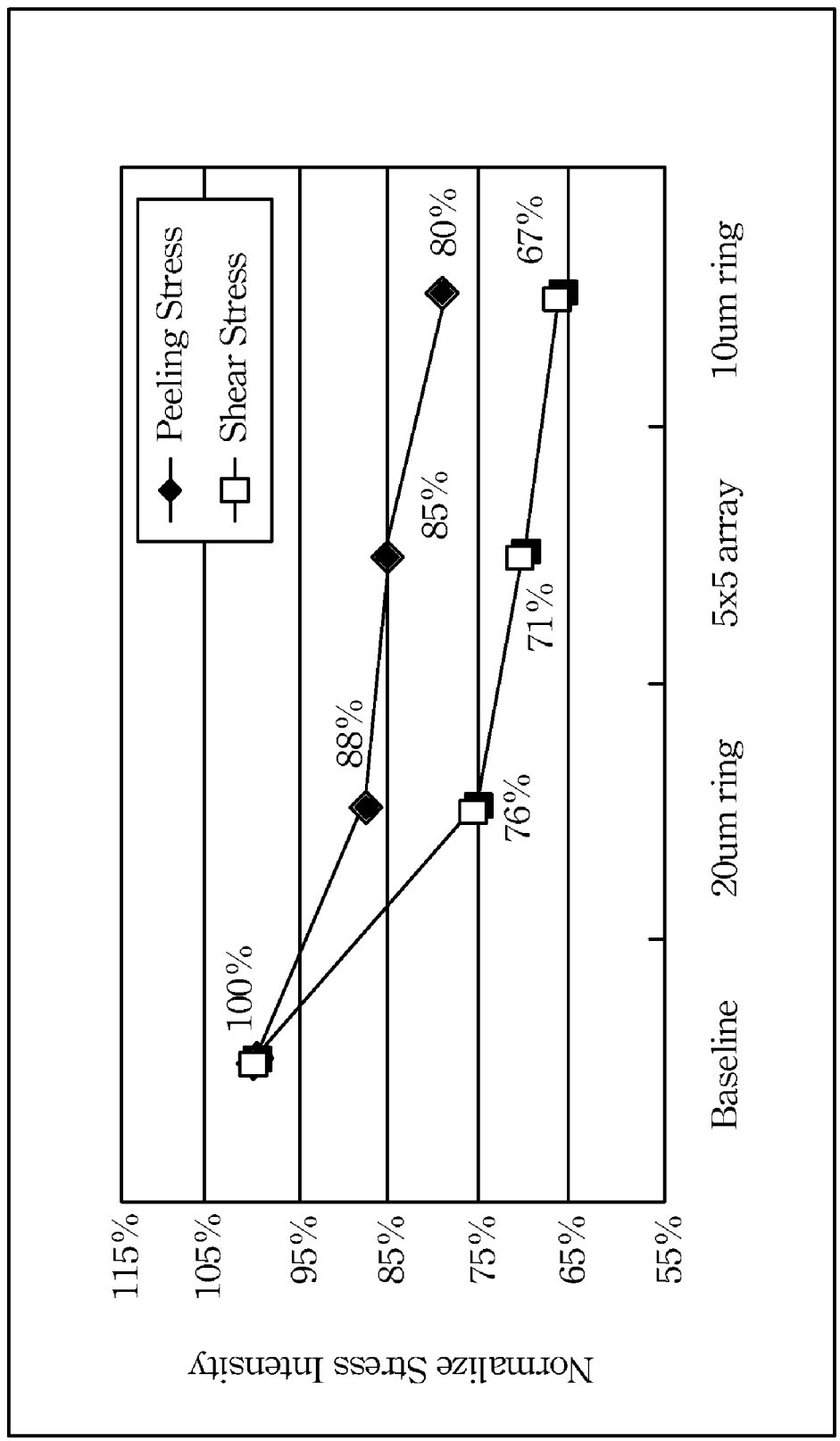
FIG. 7 is a chart illustrating how different via layouts affect the stress at the interface of the USG layer and the low-k dielectric layer.

FIG. 7 is a chart illustrating how these different layouts affect the stress at the interface of the USG layer 42 and the low-k dielectric layer 44. The solid octagonal via 48a in FIG. 6A is used as a baseline, and all other layouts are normalized to it. From the chart, one can see that the normalized stresses decrease from the baseline to the twenty micrometer octagonal ring via 48c in FIG. 6C to the five by five array of vias 48d in FIG. 6D to the ten micrometer octagonal ring via 48b in FIG. 6B.

The disadvantage of the foregoing embodiments is that more area is needed for the copper pad 40 in the USG layer 42 or that an extra metal layer must be included in the USG layer 42. As compared to the bump pad in FIG. 1A, embodiments of the invention would require an area on the top metal layer within the USG layer 42 in which to place the copper pad 40. This may necessitate re-routing circuitry on the top metal layer to clear the area for the copper pad 40. Alternatively, an extra metal layer could be added within the USG layer 42 in which to place the copper pad 40. This would not require re-routing circuitry in an existing semiconductor device design, but would cost more in terms of added processing and materials to add the extra metal layer.

FIG. 8 is another embodiment similar to that illustrated in FIG. 3, except a second copper pad 52 is under the USG layer 42 and on the low-k dielectric layer 44. Vias 50 connect the copper pad 40 to the second copper pad 52. The vias 50 may be one or many individual vias or may be a via in accordance with the layouts of vias in FIGS. 6A through 6D. Further, more copper pads may be added to the structure in FIG. 8. The copper pads may be within the multiple metal layers that comprise the USG layer 42 or may be within the USG layer 42 and the low-k dielectric layer 44. The multiple copper pads may be connected by vias or may not be connected. The addition of the second copper pad 52 further increases the Young's modulus of the structure, thus increasing the overall mechanical strength of the structure.

Other features of embodiments include a thicker aluminum pad 36 and/or aluminum trace, a thicker USG layer 42, or merely having vias 48 through the inner passivation layer 38 without an underlying copper pad. Generally, an aluminum pad 36 is about 1.45 µm thick. Increasing this thickness, for example to 2.5 µm, may increase the mechanical strength of the structure and will protect the USG layer 42 and low-k dielectric layer 44 more. Likewise, increasing the thickness of the USG layer 42 may increase the mechanical strength of the USG layer 42 to increasingly protect the USG layer 42 and the low-k dielectric layer 44. The USG layer 42 may be thickened by increasing the thickness of existing layers within the USG layer 42 or by adding new layers within the USG layer 42. Further, vias 48 through the inner passivation layer 38 alone without an underlying copper pad may increase the mechanical strength of the structure over conventional bump pads.

Figure 9A:
FIGS. 9A through 9M illustrate a process to create a bump pad structure in accordance with an embodiment of the present invention.
Figure 9B:
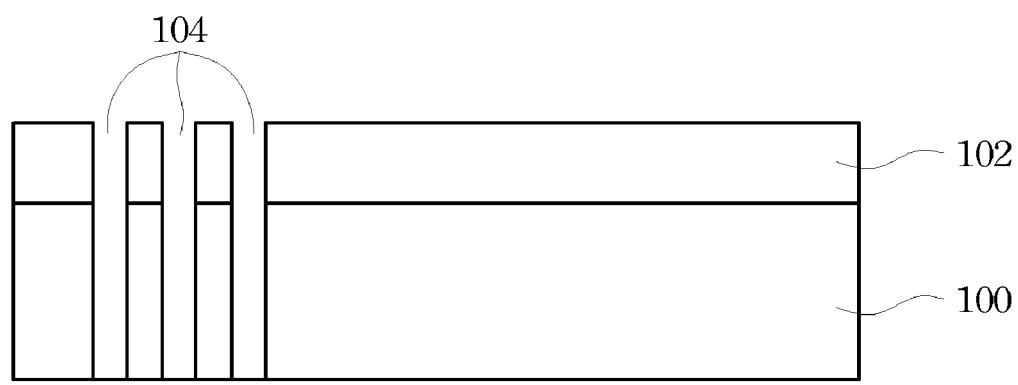
Figure 9C:
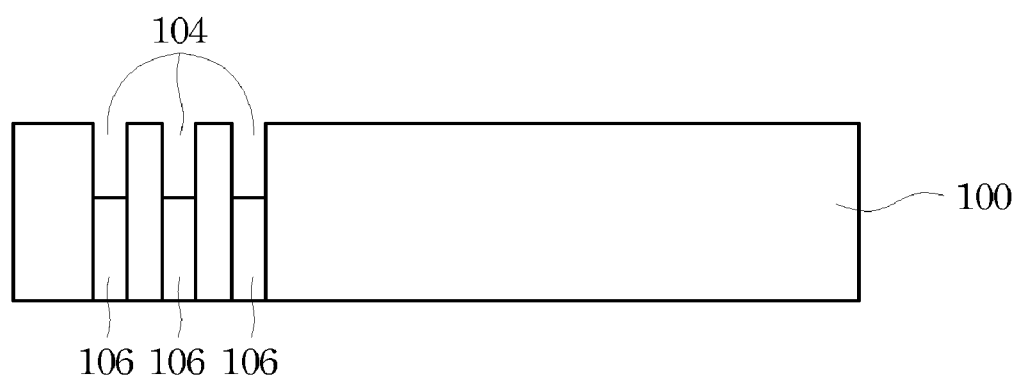
Figure 9D:
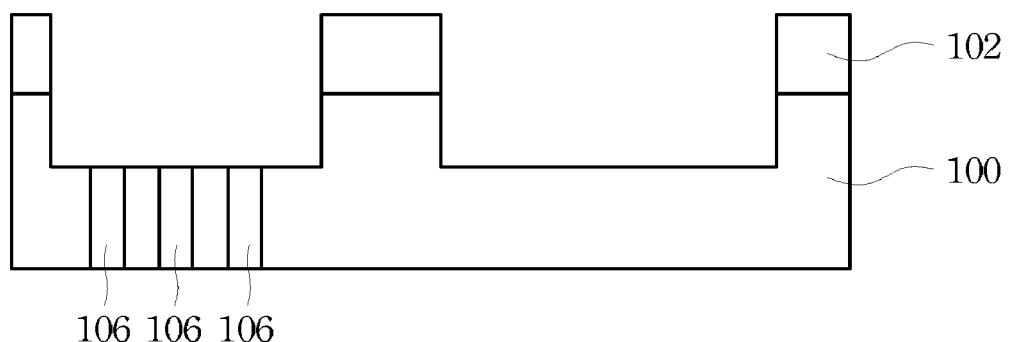

FIGS. 9A through 9M illustrate a process to build the bump pad structure in FIG. 3 according to another embodiment. In FIG. 9A, the USG layer 100 is formed on a low-k dielectric layer (not shown). In FIG. 9B, a photoresist layer 102 is patterned on the USG layer 100 to expose the USG layer 100 where interconnect via openings 104 are to be etched. Then, the interconnect via openings 104 are etched using known photolithography techniques. In FIG. 9C, the interconnect via openings 104 are then partially filled with plugs 106 and the photoresist layer 102 is removed. In FIG. 9D, another photoresist layer 108 is formed on the USG layer 100 and patterned to expose the USG layer 100 where an interconnect contact is to be formed over the interconnect via openings 104 and where a copper pad is to be formed. The USG layer 100 is then etched to a depth of at least to the top of the plugs 106 using known photolithography techniques.

Figure 9E:
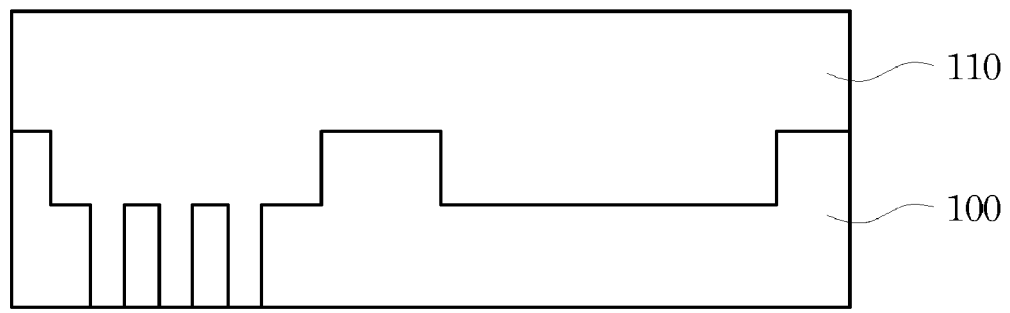
Figure 9F:
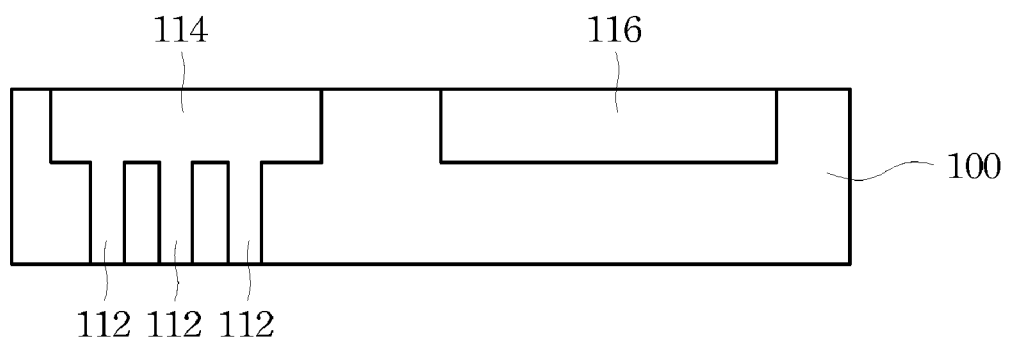

In FIG. 9E, the photoresist layer 108 and plugs 106 are removed. Next, copper 110 is deposited on the USG layer 100. A diffusion barrier layer may be formed using physical vapor deposition before depositing the copper 110. Also, a copper seed layer may be formed for electroplating after forming the diffusion barrier layer but before depositing the copper 110. In FIG. 9F, any excess copper 110 is removed, such as by chemical mechanical polish. This forms the interconnect vias 112, the interconnect contact 114, and the copper pad 116. Alternatively, conventional dual damascene process steps may be employed to form the interconnect vias 112, the interconnect contact 114, and the copper pad 116.

Figure 9G:
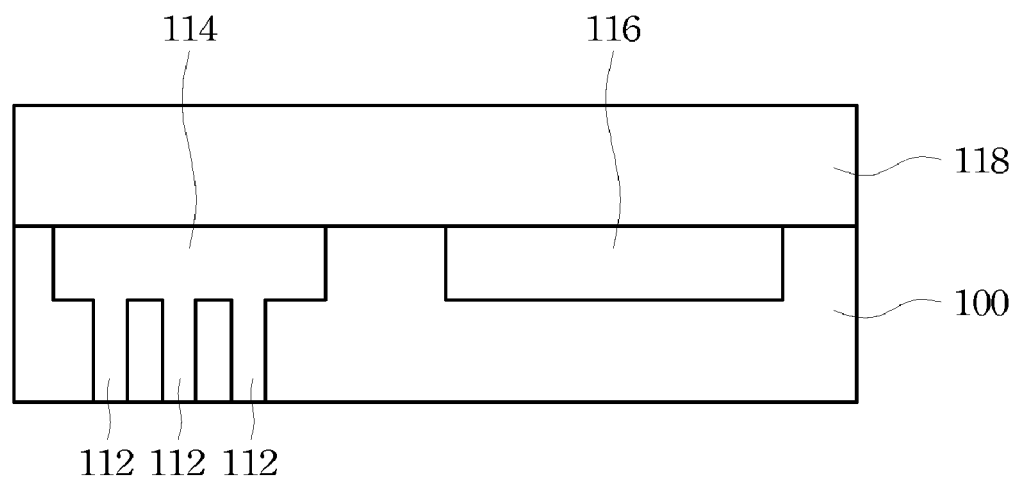
Figure 9H:
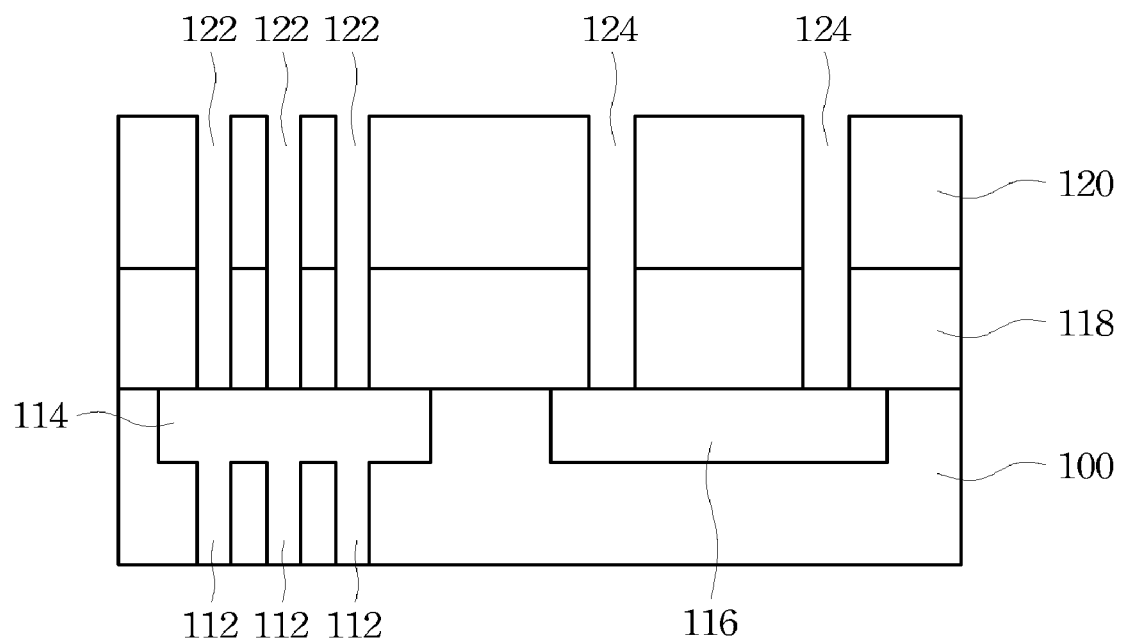
Figure 9I:
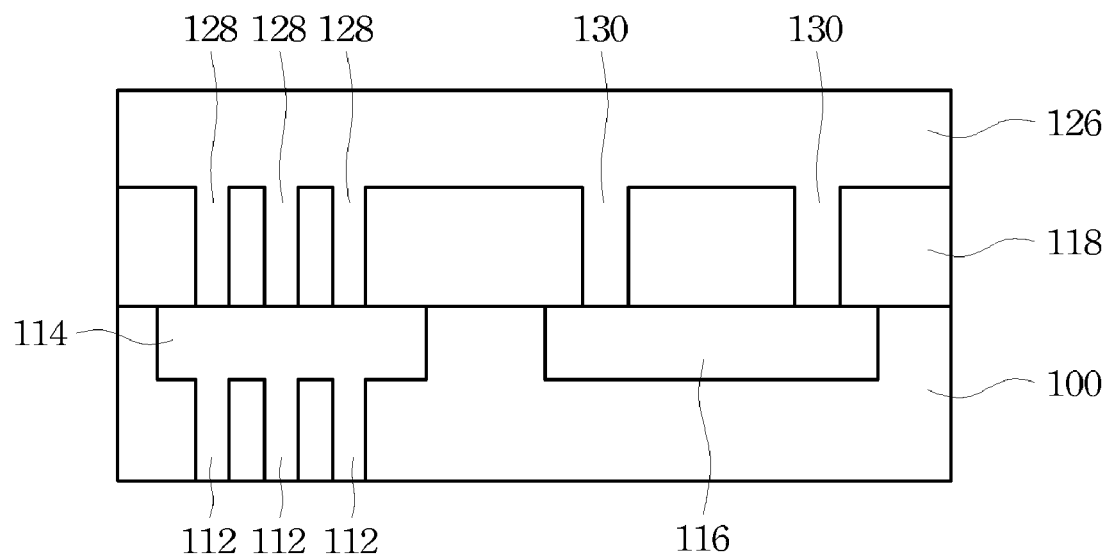
Figure 9J:
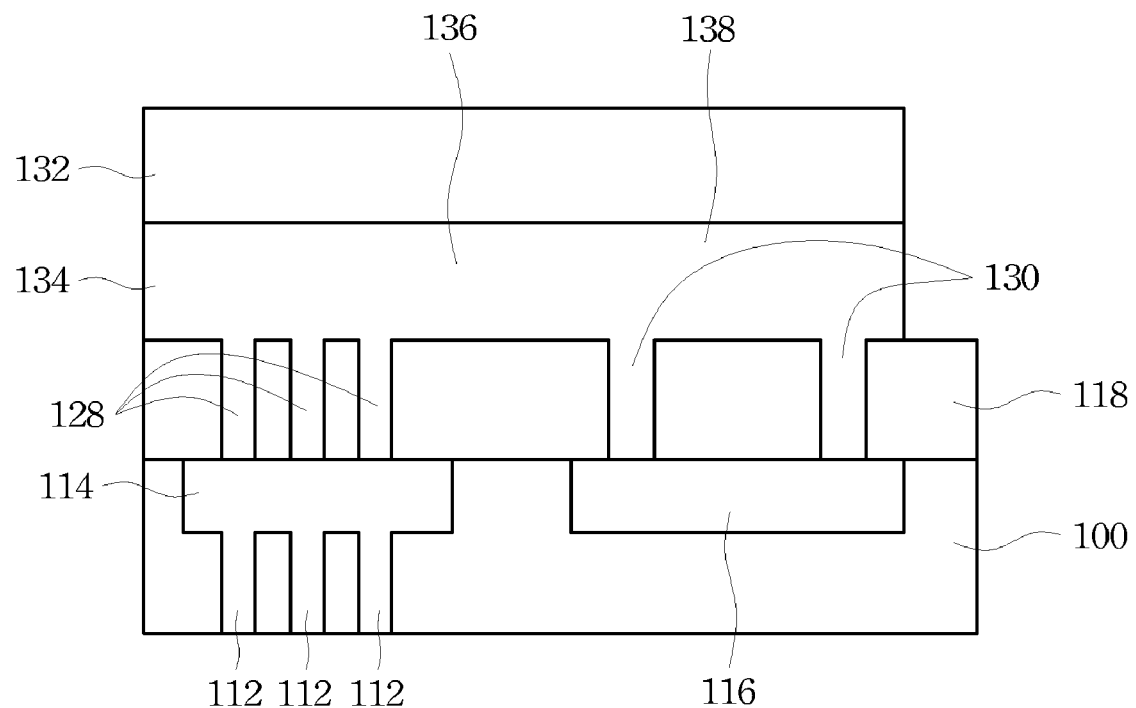

In FIG. 9G, a first passivation layer 118 is deposited over the USG layer 100. In FIG. 9H, a photoresist layer 120 is formed on the first passivation layer 118. The photoresist layer 120 is patterned to expose portions of the first passivation layer 118 that overlie the interconnect contact 114 and the copper pad 116. The first passivation layer 118 is then etched using known photolithography techniques leaving via openings 122 and 124. In FIG. 9I, the photoresist layer 120 is removed and aluminum 126 is deposited. The aluminum 126 fills the via openings 122 to form aluminum interconnect vias 128 and fills the via openings 124 to form aluminum vias 130. In FIG. 9J, a photoresist layer 132 is formed over the aluminum 126 and patterned to form an aluminum interconnect contact 134, an aluminum trace 136, and an aluminum pad 138. The aluminum 126 is then etched to form those components.

Figure 9K:
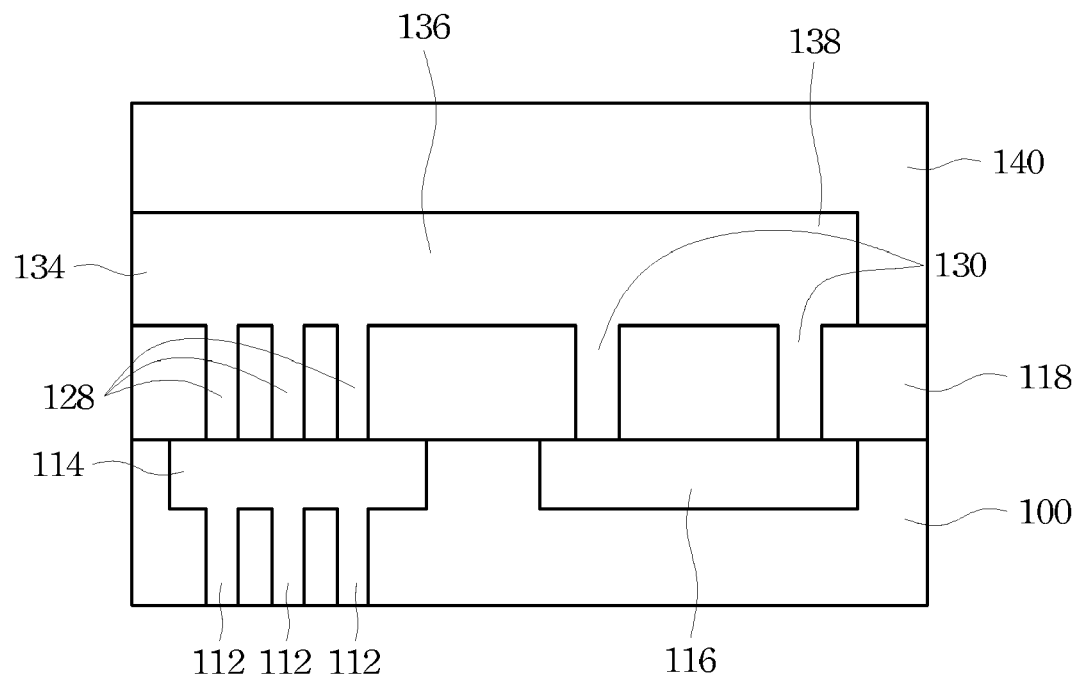
Figure 9L:
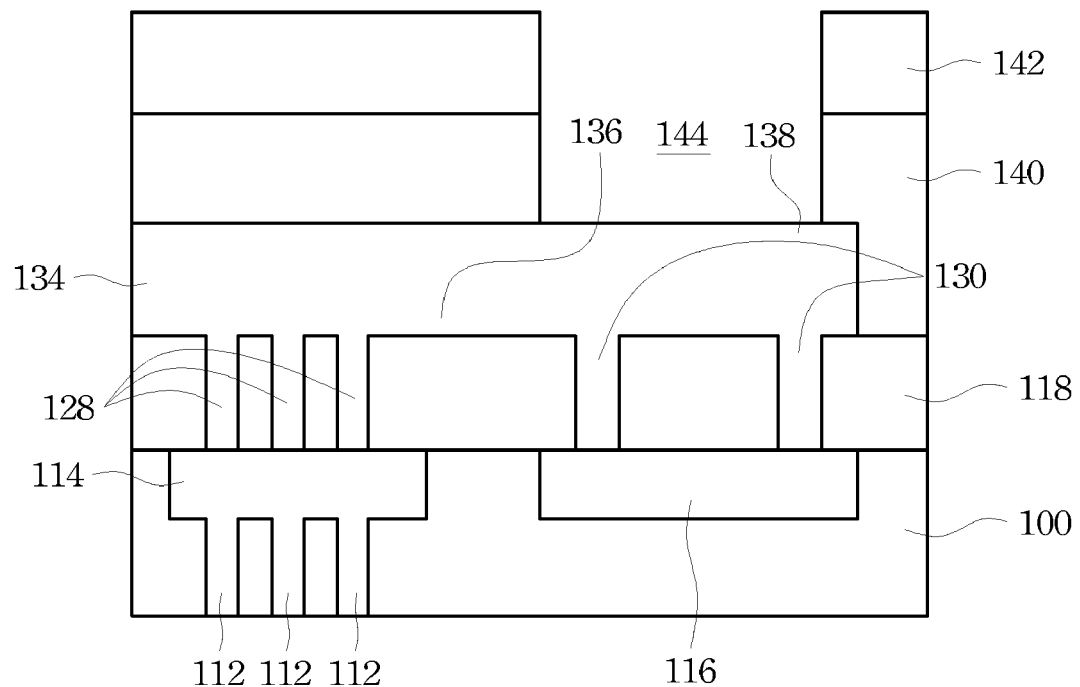
Figure 9M:
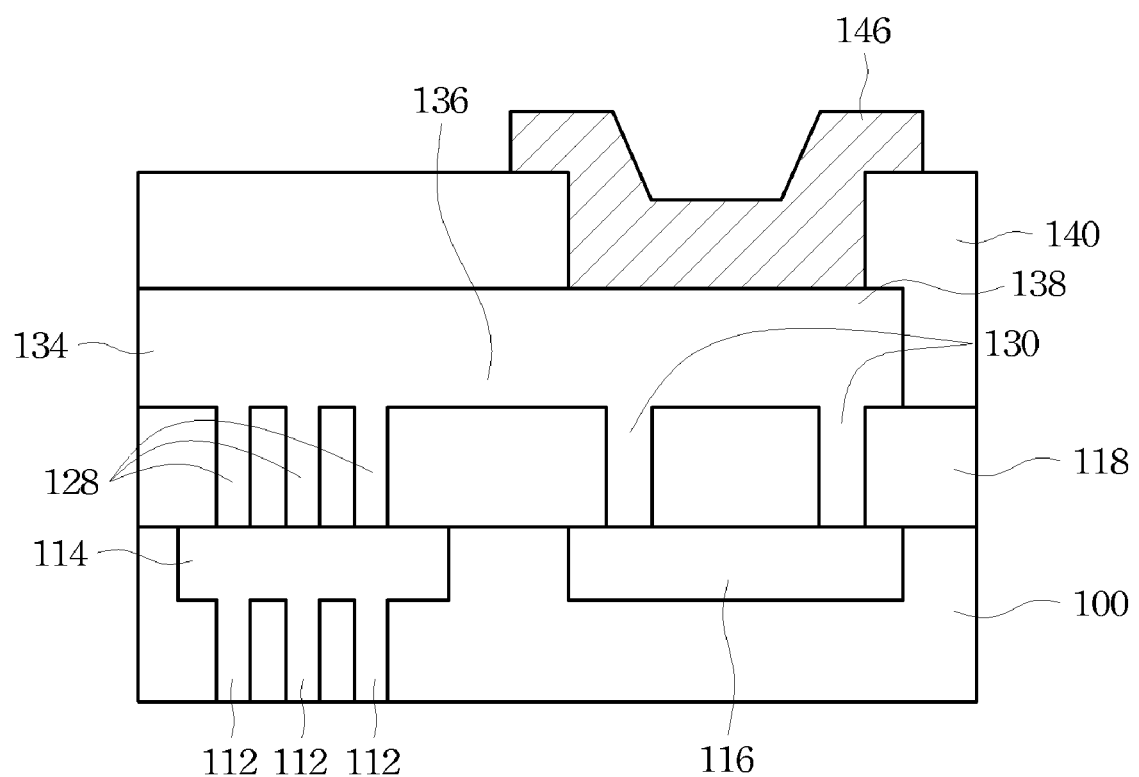

In FIG. 9K, the photoresist layer 132 is removed, and a second passivation layer 140 is deposited on the structure. In FIG. 9L, a photoresist layer 142 is formed on the second passivation layer 140 and patterned to expose a portion of the second passivation layer 140 above the aluminum pad 138. The second passivation layer 140 is then etched down to the aluminum pad 138 leaving a UBM opening 144. In FIG. 9M, the photoresist layer 142 is removed, and a UBM pad 146 is formed in the UBM opening 144 and is connected to the aluminum pad 138.

Although the present invention and its advantages have been described in detail, it should be understood that various changes, substitutions and alterations can be made herein without departing from the spirit and scope of the invention as defined by the appended claims. For example, although many of the feature of the embodiments describe above have comprised either copper or aluminum, each feature may comprise copper instead of the described aluminum, or vice versa. As another example, it will be readily understood by those skilled in the art that the layers described above, i.e. the passivation layers, the USG layer, and the low-k dielectric layer, are not necessarily the layers present in a structure in accordance with the foregoing embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A bump bond pad structure comprising:
   a substrate comprising a top layer;
   a reinforcement pad disposed on the top layer, a shape of the reinforcement pad being in a first plane parallel to a top surface of the top layer;
   an intermediate layer above the top layer;
   an intermediate connection pad disposed on the intermediate layer;
   an outer layer above the intermediate layer; and
   an under bump metal (UBM) connected to the intermediate connection pad through an opening in the outer layer, a shape of the UBM being in a second plane parallel to the first plane, the shape of the UBM corresponding to the shape of the reinforcement pad.

2. The bump bond pad structure of claim 1, wherein the reinforcement pad has a radius or circumradius that is larger than a radius or circumradius of the UBM.

3. The bump bond pad structure of claim 2, wherein the radius or circumradius of the reinforcement pad is at least five (5) micrometers larger than the radius or circumradius of the UBM.

4. The bump bond pad structure of claim 1 further comprising a via mechanically coupling the intermediate connection pad to the reinforcement pad.

5. The bump bond pad structure of claim 4, wherein the via comprises a feature selected from the group consisting of a solid via, a substantially ring-shaped via, or a five by five array of vias.

6. The bump bond pad structure of claim 5, wherein the substantially ring-shaped via is between about ten (10) micrometers thick and about twenty (20) micrometers thick.

7. The bump bond pad structure of claim 1, wherein the intermediate connection pad is about 2.5 micrometers thick.

8. The bump bond pad structure of claim 1, further comprising a trace electrically coupling the intermediate connection pad to an interconnect structure.

9. The bump bond pad structure of claim 1 further comprising:
a secondary reinforcement pad, wherein the substrate further comprises an inner layer, and wherein the secondary reinforcement pad is disposed on the inner layer; and
a second via mechanically coupling the reinforcement pad to the secondary reinforcement pad.

10. The bump bond pad structure of claim 1, wherein the reinforcement pad comprises copper, and wherein the intermediate connection pad comprises aluminum.

11. A bump bond pad structure comprising:
a copper pad on a top layer of a substrate;
an aluminum pad on an inner passivation layer, wherein the inner passivation layer is on the top layer of the substrate;
a via mechanically coupling the copper pad to the aluminum pad; and
an under bump metal (UBM) mechanically and electrically coupled to the aluminum pad through an opening in an outer passivation layer.

12. The bump bond pad structure of claim 11, wherein a circumradius of the copper pad is at least five (5) micrometers larger than a circumradius of the aluminum pad.

13. The bump bond pad structure of claim 11, wherein the via comprises a solid via, a substantially circular ring via, or an array of vias.

14. The bump bond pad structure of claim 11, wherein the aluminum pad is about 2.5 micrometers thick.

15. The bump bond pad structure of claim 11 further comprising:
a secondary copper pad on an inner layer of the substrate; and
a secondary via mechanically coupling the secondary copper pad to the copper pad.

16. A method for creating a bump bond pad structure, the method comprising:
forming a reinforcement pad on a top layer of a substrate;
forming an intermediate layer on the top layer of the substrate;
forming an intermediate connection pad on the intermediate layer and a via through the intermediate layer to couple the intermediate connection pad to the reinforcement pad;
forming an outer layer over the substrate; and
forming an under bump metal (UBM) in an opening of the outer layer to couple the UBM to the intermediate connection pad.

17. The method of claim 16 further comprising:
forming a secondary reinforcement pad on an under layer of the substrate; and
wherein the forming the reinforcement pad further comprises forming a secondary via through the top layer of the substrate to couple the reinforcement pad to the secondary reinforcement pad.

18. The method of claim 16, wherein the forming the reinforcement pad comprises:
patterning a resist layer over the top layer of the substrate to expose an area of the top layer where the reinforcement pad will be disposed;
etching the exposed area of the top layer; and
depositing a metal on the top layer.

19. The method of claim 16, wherein the forming the intermediate connection pad comprises:
patterning a first resist layer over the intermediate layer to expose an area of the intermediate layer where the via will be formed;
etching the exposed area of the intermediate layer;
depositing a metal layer on the intermediate layer to form a metallization layer and the via;
patterning a resist layer on the metallization layer such that the portion of the metallization layer that will be formed into the intermediate connection pad is not exposed; and
etching an exposed portion of the metallization layer.

20. The method of claim 16, wherein the forming the UBM further comprises:
patterning a resist layer over the outer layer to expose an area of the outer layer where the opening will be formed; and
etching the outer layer to form the opening.

* * * * *